(12) United States Patent
Gersdorff et al.

(10) Patent No.: US 9,045,818 B2
(45) Date of Patent: Jun. 2, 2015

(54) SHADOW MASK HELD MAGNETICALLY ON A SUBSTRATE SUPPORT

(75) Inventors: Markus Gersdorff, Herzogenrath (DE);
Walter Franken, Eschweiler (DE);
Arno Offermanns, Aldenhoven (DE)

(73) Assignee: Aixtron SE, Herzogenrath (DE)

( * ) Notice: Subject to any disclaimer, the term of this patent is extended or adjusted under 35 U.S.C. 154(b) by 407 days.

(21) Appl. No.: 13/119,423
(22) PCT Filed: Sep. 23, 2009
(86) PCT No.: PCT/EP2009/062306
§ 371 (c)(1),
(2), (4) Date: Mar. 16, 2011
(87) PCT Pub. No.: WO2010/034733
PCT Pub. Date: Apr. 1, 2010

(65) Prior Publication Data
US 2011/0174217 A1 Jul. 21, 2011

(30) Foreign Application Priority Data
Sep. 24, 2008 (DE) .......................... 10 2008 037 387

(51) Int. Cl.
*C23C 16/00* (2006.01)
*B05C 21/00* (2006.01)
(Continued)

(52) U.S. Cl.
CPC .............. *C23C 16/042* (2013.01); *B05C 21/005* (2013.01); *H01L 51/0011* (2013.01);
(Continued)

(58) Field of Classification Search
CPC ...... B05C 21/005; B05C 17/06; B05C 17/08;
B05C 17/12; B05C 17/0222; B05C 17/0225;
B05C 17/04; B05C 17/10; B05B 15/04;
B05B 15/0406; B05B 15/0412; B05B
15/0418; B05B 15/0425; B05B 15/0431;
B05B 15/0437; B05B 15/0443; B05B 15/045;
B05B 15/0456; B05B 15/0462; B05B
15/0468; B05B 15/0475; B05B 15/0481;
B05B 15/0487; B05B 15/0493; C23C 14/04;
C23C 14/042; C23C 14/044; C23C 16/04;
C23C 16/042; C23C 16/044; H01L 51/0011;
H01L 21/368; H01L 21/308; H01L 21/3083;
H01L 21/673; H01L 21/6835

USPC .............................. 118/500, 715; 438/23, 29
See application file for complete search history.

(56) References Cited

U.S. PATENT DOCUMENTS 3,170,810 A * 2/1965 Kagan ........................... 427/598
4,615,781 A   10/1986 Boudreau
(Continued)

FOREIGN PATENT DOCUMENTS

DE          29797686       *   6/1997   .............. B05C 17/08
WO     2008/026524 A1      3/2008

OTHER PUBLICATIONS

Aixtron SE; International Application No. PCT/EP2009/062306 filed Sep. 23, 2009; International Search Report and Written Opinion; ISA/EP; Jan. 19, 2010; 10pp.
(Continued)

*Primary Examiner* — Dah-Wei D Yuan
*Assistant Examiner* — Karl Kurple
(74) *Attorney, Agent, or Firm* — Ascenda Law Group, PC

(57) ABSTRACT

The invention relates to a device for depositing laterally structured layers on a substrate (2) situated on a substrate support (1), using a shadow mask (3) lying flat on the substrate surface (2') to be coated, the substrate support (1) having first magnetic zones (4) for magnetically attracting second magnetic zones (5) of the shadow mask (3) that are associated with these first magnetic zones (4), wherein, before coating the substrate (2) and when the shadow mask (3) is lying on the substrate (2), the first magnetic zones (4) may be brought into an active position in which the second magnetic zones (5) are drawn toward the substrate surface (2'), and, for placement or removal of the shadow mask (3), the first magnetic zones may be brought into an inactive position in which the attractive force acting on the second magnetic zones (5) is reduced. It is important that the first magnetic zones (4) are formed from magnetic elements, in particular permanent magnetic elements, situated in recesses (6) in a substrate support surface (1') of the substrate support (1), which are spatially associated with the second magnetic zones (5).

11 Claims, 15 Drawing Sheets

(51) Int. Cl.
*B25B 11/00* (2006.01)
*C23C 16/04* (2006.01)
*H01L 21/673* (2006.01)
*C23C 16/458* (2006.01)
*C23C 16/46* (2006.01)
*H01L 21/687* (2006.01)
*B05D 1/32* (2006.01)
*H01L 51/00* (2006.01)

(52) U.S. Cl.
CPC .......... *H01L21/673* (2013.01); *C23C 16/4586* (2013.01); *C23C 16/463* (2013.01); *H01L 21/68742* (2013.01)

(56) References Cited

U.S. PATENT DOCUMENTS

| | | | |
|---|---|---|---|
| 4,963,921 A * | 10/1990 | Kariya et al. | 355/53 |
| 5,608,773 A * | 3/1997 | Korenaga et al. | 378/34 |
| 5,656,398 A * | 8/1997 | Miyachi et al. | 430/5 |
| 5,793,474 A * | 8/1998 | Nishi | 355/72 |
| 5,847,813 A * | 12/1998 | Hirayanagi | 355/75 |
| 6,590,633 B1 * | 7/2003 | Nishi et al. | 355/53 |
| 6,927,839 B2 * | 8/2005 | Taniguchi et al. | 355/72 |
| 7,411,652 B2 * | 8/2008 | Bleeker et al. | 355/53 |
| 7,718,006 B2 * | 5/2010 | Koeda et al. | 118/721 |
| 7,771,789 B2 * | 8/2010 | Yotsuya et al. | 427/248.1 |
| 7,964,421 B2 * | 6/2011 | Moriyama | 438/29 |
| 8,361,230 B2 * | 1/2013 | Manz | 118/721 |
| 2003/0180474 A1 * | 9/2003 | Nishikawa | 427/468 |
| 2003/0228417 A1 * | 12/2003 | Nishikawa et al. | 427/248.1 |
| 2005/0130356 A1 * | 6/2005 | Yotsuya | 438/172 |
| 2006/0011136 A1 * | 1/2006 | Yamazaki et al. | 118/719 |
| 2006/0148114 A1 * | 7/2006 | Yotsuya et al. | 438/29 |
| 2006/0150910 A1 | 7/2006 | Han et al. | |
| 2006/0175993 A1 * | 8/2006 | Shibata et al. | 318/135 |
| 2006/0269385 A1 * | 11/2006 | Zobel et al. | 414/403 |
| 2006/0281206 A1 * | 12/2006 | Brody | 438/23 |
| 2007/0009671 A1 * | 1/2007 | Manz | 427/468 |
| 2007/0296324 A1 * | 12/2007 | Yoo et al. | 313/402 |
| 2011/0304418 A1 * | 12/2011 | Schuessler et al. | 335/289 |

OTHER PUBLICATIONS

Aixtron SE; International Application No. PCT/EP2009/062306 filed Sep. 23, 2009; English translation of International Preliminary Examination Report on Patentability dated Mar. 29, 2011; IPEA/IB; 7 pages.

EP Application No. 09736391.5; Amendments received before examination; Aug. 13, 2011; 5 pages.

* cited by examiner

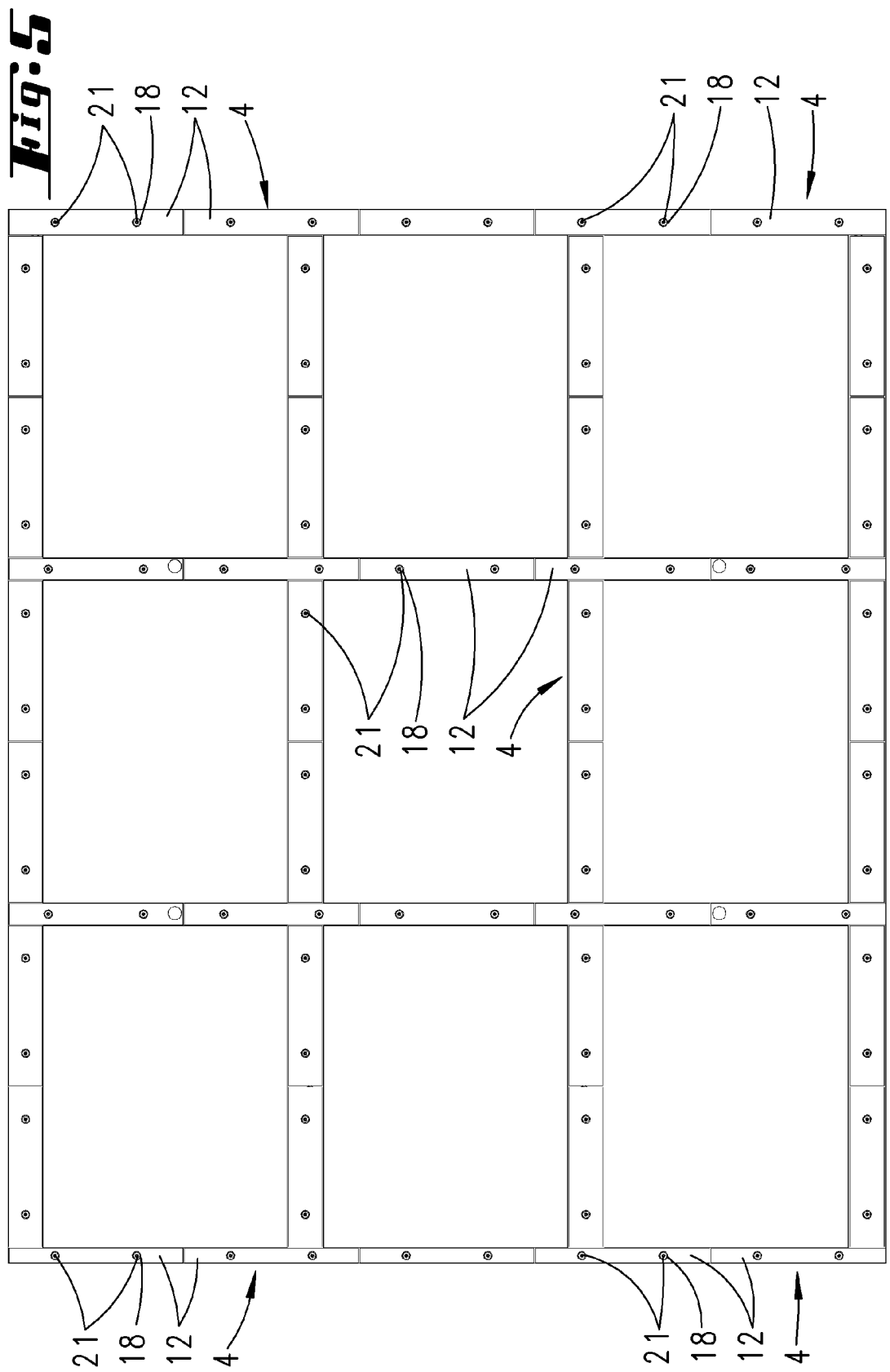

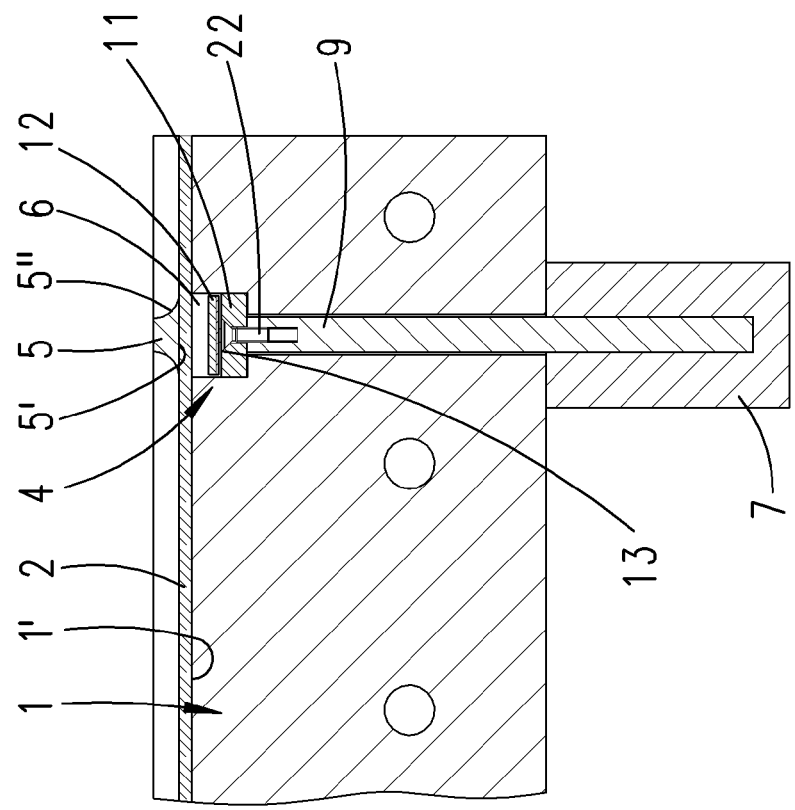
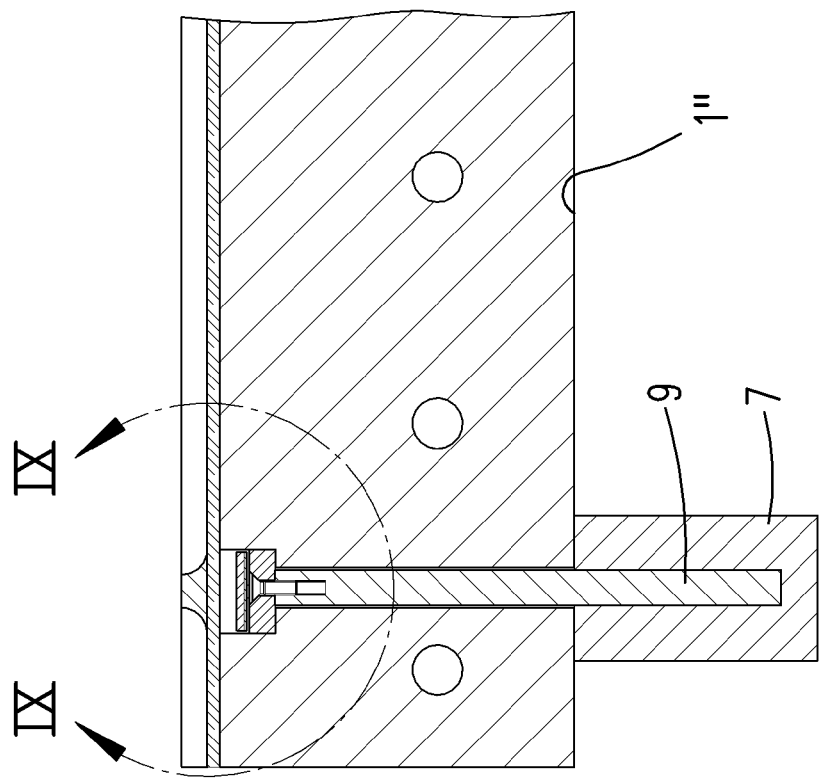

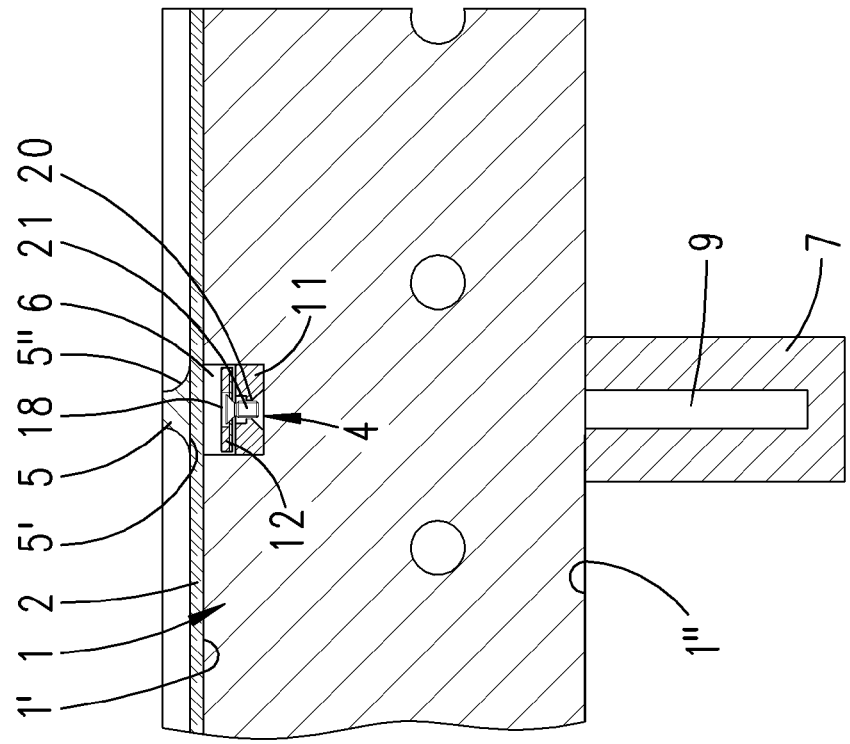
fig. 7
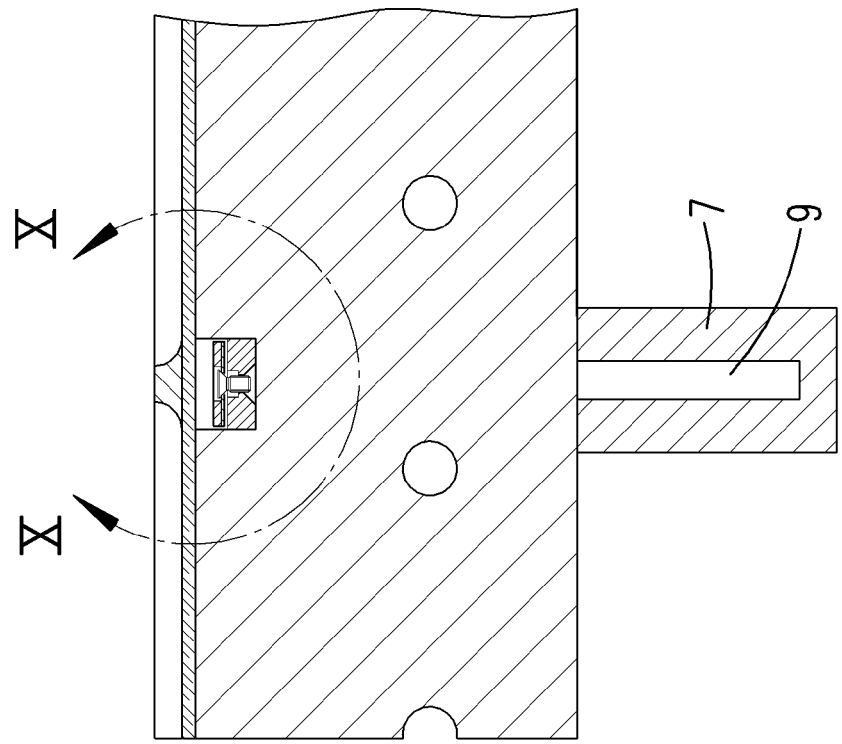

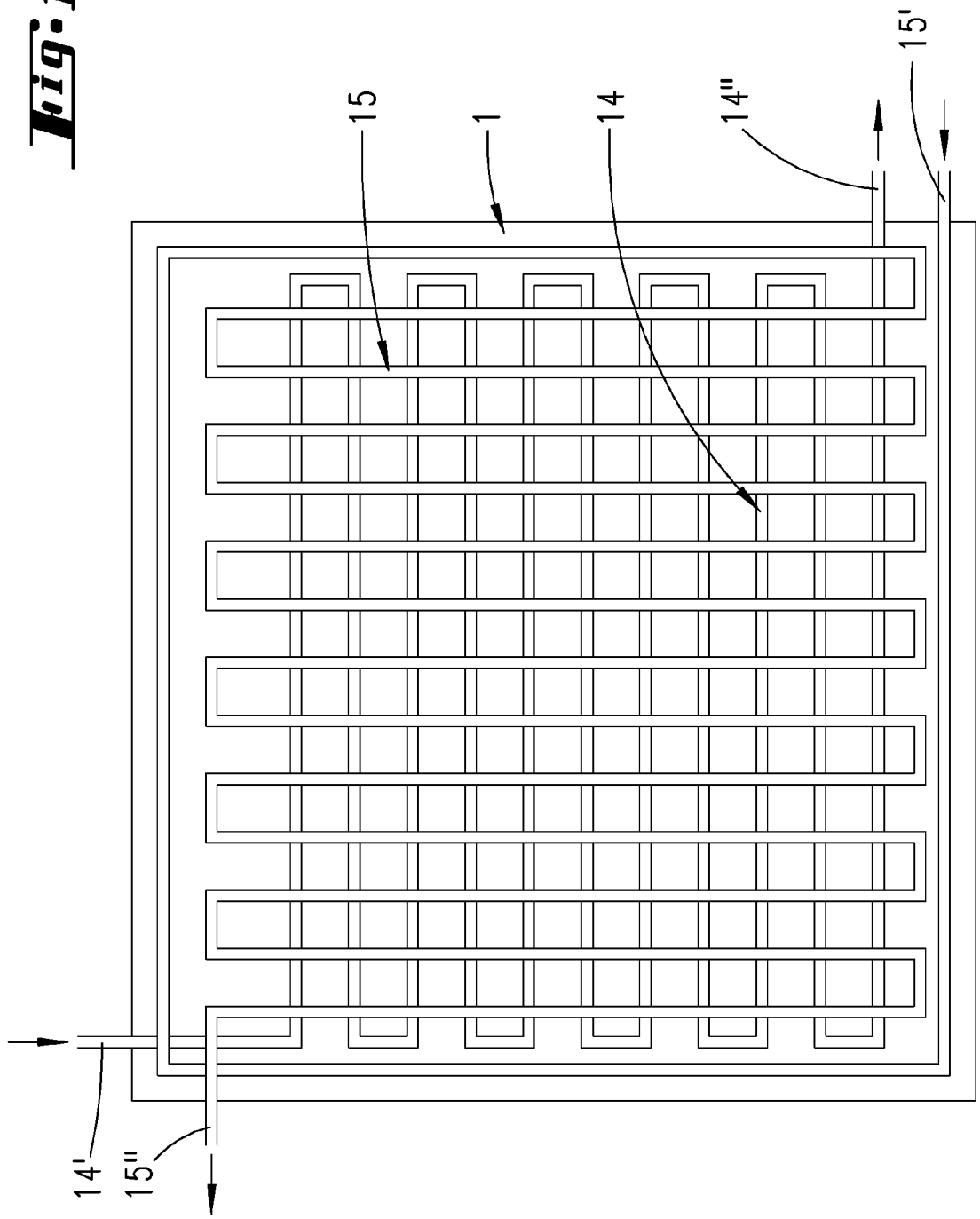

SHADOW MASK HELD MAGNETICALLY ON A SUBSTRATE SUPPORT

CROSS REFERENCE TO RELATED APPLICATIONS

This is a NATIONAL STAGE under 35 USC 371 of and claims priority to International Application PCT/EP2009/06230, filed 23 Sep. 2009, incorporated herein by reference, which claims priority to DE 10 2008 026973.5, filed 3 Jun. 2008, and DE 10 2008 037387.7, filed 24 Sep. 2008.

FIELD OF THE INVENTION

The invention relates to a method for depositing laterally structured layers on a substrate situated on a substrate support, using a shadow mask lying flat on the substrate surface to be coated.

The invention further relates to a device for depositing laterally structured layers on a substrate situated on a substrate support, using a shadow mask lying flat on the substrate surface to be coated.

The invention further relates to a substrate support for such a device or for carrying out such a method, and a shadow mask.

For a coating process in which a laterally structured layer is deposited on a substrate, the layer-forming components are introduced in gaseous form or in the form of aerosols through a gas inlet element into a process chamber. The process chamber may be oriented in the horizontal direction. The cover of the process chamber may be formed by a gas inlet element. The latter may form outlet openings, arranged in the manner of a shower head, for the process gas or the aerosol. The coating process may be carried out in a vacuum, at low pressure, or also at atmospheric pressure. A shadow mask is used to deposit lateral structures on the substrate. The shadow mask is intended to lie in direct, uniform surface contact with the coating surface of the substrate.

BACKGROUND

It is an object of the invention to specify measures by means of which the mask lies on the substrate surface with as few gaps as possible.

SUMMARY OF THE INVENTION

The object is achieved by a refinement of the method, it being important that the substrate support has first magnetic zones, and the shadow mask has second magnetic zones that are spatially associated with these first magnetic zones, wherein, before coating the substrate and when the shadow mask is lying on the substrate, the first magnetic zones are brought into an active position in which the second magnetic zones are drawn toward the substrate surface, and, for placement or removal of the shadow mask, the first magnetic zones are brought into an inactive position in which the attractive force acting on the second magnetic zones is reduced. The object is further achieved by a refinement of the device, it being important that the substrate support has first magnetic zones for magnetically attracting second magnetic zones of the shadow mask that are spatially associated with these first magnetic zones, wherein, before coating the substrate and when the shadow mask is lying on the substrate, the first magnetic zones may be brought into an active position in which the second magnetic zones are drawn toward the substrate surface, and, for placement or removal of the shadow mask, the first magnetic zones may be brought into an inactive position in which the attractive force acting on the second magnetic zones is reduced.

The subclaims represent advantageous refinements of the invention, and in their formulations as independent claims also represent independent achievements of the object.

Basically, a method and a device for carrying out the method are provided, the substrate support having a first magnetic zone and the shadow mask having a second magnetic zone. A plurality of first magnetic zones, and second magnetic zones of the shadow mask spatially associated with these first magnetic zones, are preferably provided. Before coating the substrate and when the shadow mask is lying on the substrate, the first magnetic zones are brought into an active position. In this active position the second magnetic zones of the shadow mask are drawn toward the substrate surface. For placement or removal of the shadow mask the first magnetic zones of the substrate support may be brought into an inactive position. In the inactive position the attractive force acting on the second magnetic zones is reduced. The substrate support is preferably characterized by first magnetic zones which lie in recesses of the substrate support. The recesses may be formed by grooves in the substrate bearing surface of the substrate support. Permanent magnetic movable elements in particular may lie in these grooves. The first or second magnetic zones may be formed by magnetic, in particular permanent magnetic, elements, and the other respective magnetic zones may preferably be formed by ferromagnetic elements. As a result of the embodiment according to the invention, the shadow mask is mechanically contacted in the region of its magnetic zones due to force action by permanent magnets. The direct contact of the shadow mask with the substrate minimizes the shadow effect to near zero microns. The device thus allows an active coating surface to be separated from a passive coating surface. The substrate support on which the substrate lies is preferably formed by a cooler. However, a heated substrate support may also be used. In that case, the substrate and in particular the active coating surface of the substrate are temperature-controlled in particular due to the separation of the active coating surface from the passive coating surface. In one preferred embodiment of the invention, the first magnetic zones may be displaced transverse to the surface normals of the substrate bearing surface in order to be moved back and forth between an active position and an inactive position. The permanent magnetic elements associated with the substrate support form a grid-like structure and lie in intersecting grooves in the substrate bearing surface. The second magnetic zones of the shadow mask likewise form a grid structure, the grid webs of the shadow mask being spatially associated with the grid webs of the permanent magnetic elements of the substrate support. The passive coating surface is thus covered by a closed mask portion, and may possibly be coated as well in the coating process, at a reduced coating rate, and thus is not temperature-controlled. The webs which form the second magnetic zones of the shadow mask are made of a ferromagnetic material, in particular Invar. The magnetic webs of the substrate support have a multipart design and are separated from one another. In one preferred embodiment, these webs are composed of a substantially one-part support member having the shape of the grid, and a multiplicity of magnetic strips held by the support member. The magnetic strips are loosely connected to the support member, which has a vertical play of motion of approximately 0.1 mm, so that each individual movable magnetic strip has a travel path or a height flexibility having this value. Manufacturing tolerances may be compensated for in this manner. The magnetic strip itself likewise has a two-part design. The magnetic strip is composed of a permanent magnetic strip which is fixedly connected to a lining plate made of metal. The permanent magnetic strip may be adhesively bonded to the lining plate. The connection between the magnetic strip and the support member is established using screws, preferably countersunk screws, the countersunk head lying in a recess of larger diameter which is formed by the permanent magnetic strip. The shank of the screw passes through a through opening in the lining strip and is screwed into a threaded hole in the support member. The grid-like frame which forms the support member may be adjusted in height within an accuracy of 10 µm, using a lift system. The lift system is composed of at least one lift mechanism which is situated on the side of the substrate support facing away from the bearing surface of the substrate support, i.e., on the back side of the substrate support. The frame-like support member has a multiplicity of lift plungers which project through openings in the substrate support. The lift mechanisms engage with these plungers on the back side of the substrate support. The lift mechanisms may be short-stroke pneumatic cylinders. A lifting device may be associated with each plunger. The lifting cylinder is connected to a base plate via a cylinder bracket. The base plate carries the substrate support, which is designed as a cooler. Pneumatic connections which are sealed with respect to the surroundings, i.e. the process chamber and a vacuum present therein, are situated on the short-stroke pneumatic cylinders. The screw which is used to secure the magnetic strip to the support member has the function of a spacer screw. The screw-in depth thereof defines the range by which the magnetic strip may be spaced from the support member. This range is between 0.1 mm and 0.3 mm. A spacer screw via which the plunger lift is adjustable may also be provided in the region of the pneumatic cylinder. The lift mechanism preferably displaces the plunger, and therefore also the support member, in a stop-limited manner. The total lift may be approximately 2 to 8 mm. In the unactivated state, the support member lies on the base of the recesses in the bearing surface of the substrate support. In this state the magnetic strip lies approximately 2 to 8 mm, preferably 3 mm, below the bearing surface. In this state the pneumatic cylinders are in an end stop position. In this position the substrate, which is made of glass, paper, or some other suitable material, may be laid on the bearing surface of the substrate support, which preferably is made of aluminum. The shadow mask is then brought into contact with the substrate surface. This may be carried out by either lowering the shadow mask or by raising the substrate support. An adjustment device is provided for positioning the shadow mask on the substrate in such a way that the Invar grid webs, which extend from a mask frame, lie congruently above the permanent magnetic webs of the substrate support. Since the magnetic strips are held at a distance from the bearing surface of the substrate support when the shadow mask is set down or lifted up, the magnetic attractive force exerted on the mask webs by the permanent magnets of the magnetic strip is minimized. By means of the hydraulic lift mechanism, the support member is lifted until it is in an end stop position. In this end stop position the individual magnetic strips lie approximately flush with the bearing surface of the substrate support. However, the surface of the magnetic strip may also be situated slightly above or below the bearing surface. Due to the loose connection of the magnetic strip to the support member, the magnetic strip is still able to press against the underside of the substrate due to the magnetic attractive force on the grid web of the mask. This results in a magnetic force between the magnetic strip and the ferromagnetic web of the mask which is maximized in comparison to the inactive position. The web is drawn toward the substrate surface by the magnetic force of the magnetic strip. At the edge of the substrate support there are a total of four gap monitoring sensors, preferably oppositely situated in pairs, for monitoring a possible gap between the contact face of a web of the shadow mask and the substrate surface.

The cooler which forms the substrate support preferably has two cooling circuits, through which water or another suitable coolant is led in a meandering manner through cooling channels of the cooler. The cooling circuits are overlapped in such a way that the inlet of one circuit is spatially associated with the outlet of the other circuit. Losses in cooling power over the cooling path are thus minimized. It is also provided that the two cooling channels intersect one another multiple times. The cooling channels are therefore situated in different planes relative to the bearing surface. Temperature differences on the overall cooler surface may be minimized by using such a cooling circuit arrangement. It is possible to achieve a temperature homogeneity of less than 1° C. over the entire cooler surface. The mask frame, which is made of aluminum and has the ferromagnetic webs of the mask situated therebetween, may have its own circuit which is independent from the cooler. The individual cooling circuits may be connected in parallel or in series. The cooling of the mask frame is preferably carried out independently from the cooling of the substrate support.

For carrying out the method, a substrate is introduced into the process chamber using a substrate loading and unloading system. The cooler is lowered into a loading position. The substrate is then placed on pins which pass through openings in the cooler, and is located between the substrate support and a shadow mask having webs made of Invar and a frame made of aluminum. The mask frame is situated on a specialized mask mount. After the process chamber is loaded with the substrate, which may be performed using a robotic arm, the cooler which forms the substrate support travels into an upper position directly beneath the substrate, and lifts the substrate from the pins. The substrate support then travels farther upward until the substrate surface lies against the contact face of the shadow mask. The gap between the top side of the substrate and the bottom side of the mask is adjusted using the gap monitoring sensors. Initially only the force of gravity acts on the Invar mask, since in the loading and unloading position the magnetic strips are in a lowered position. In this position the remaining gap may reach 100 µm, but is generally smaller. By means of the short-stroke pneumatic cylinders the plungers are then lifted, and the support members are lifted by the above-referenced distance of approximately 3 mm from the bearing surface. The magnetic strips are then situated in the immediate vicinity of the underside of the substrate. The magnetic strips have a minimum distance from the Invar webs of the shadow mask, and develop a sufficient permanent magnetic force on the Invar mask. The attractive force is great enough that the remaining gap between the Invar mask and the substrate is minimized to near 0 µm. After the coating process the short-stroke cylinders travel back to the end position, so that the magnetic attractive force on the Invar webs is minimized.

Substrates are coated with organic materials using the above-described device. This is preferably organic vapor phase deposition (OVPD) for OLEDs or SOLARs or display lighting. The device is also suitable for the polymer vapor phase deposition process technology. In addition, paraxylyene may be used as coating material. The use of halogenated substituents for dielectric applications and encapsulation applications is also provided. For the coating with the par-axylyene parylene C, the Invar mask is brought into surface contact with the substrate.

The invention further relates to a refinement of the mask. The mask-free portions, i.e., the interspaces between the mask webs, should acquire a special edge profile. The edge profile is adjusted in such a way that the coating terminates at the mask cutouts, and flow under the coating frame and the coating webs is minimized. For this purpose, a contact face of the webs resting on the substrate merges at an acute angle into a hollow or inclined side flank of the web.

Neither the magnetic strips nor the Invar webs of the mask corresponding thereto are in thermally conductive contact with the temperature-controlled substrate support. The magnetic strips and the webs of the mask corresponding thereto are thermally coupled to the substrate due to the fact that they are in flat contact with the substrate. For a parylene C coating, the growth rate is primarily influenced by the surface temperature. The growth on the passive substrate surface shaded by the mask is less than on the active surface of the substrate. The layer which is nevertheless deposited on the Invar mask is so thin that growth and/or overgrowth of the parylene C film from the substrate on the Invar mask is prevented. As a result, when the mask is lifted a coating of the substrate surface is not torn off or damaged. The active zone of the substrate situated in the web interspace is coated due to the cooling, whereas there is no growth on the passive surfaces. Various mask layout profiles may be realized by using this device. Circular, rectangular, square, or polygonal shapes are possible. The grid interspaces are then similarly formed. The grids may thus be provided by webs having different widths and different lateral structures.

In a refinement of the invention, it is provided that the substrate is pressed against the bearing surface of the substrate support with the aid of the magnetic strips. This is possible by means of a correspondingly precise adjustment of the spacer screws which are used to secure the magnetic strips to the support member. This ensures enhanced cooling contact and improved heat dissipation. An electrostatic chuck system may also be provided to apply the substrate against the substrate support with force.

One exemplary embodiment of the invention is explained below with reference to accompanying drawings, which show the following:

BRIEF DESCRIPTION OF THE DRAWINGS

FIG. 5 shows a top view of the magnetic web arrangement;

FIG. 6 shows a region according to line VI-VI in FIG. 3;

FIG. 7 shows a region according to line in FIG. 3;

FIG. 15 shows in a rough schematic manner the interior structure of a substrate support in a plane that is parallel to the bearing surface.

Figure 14:
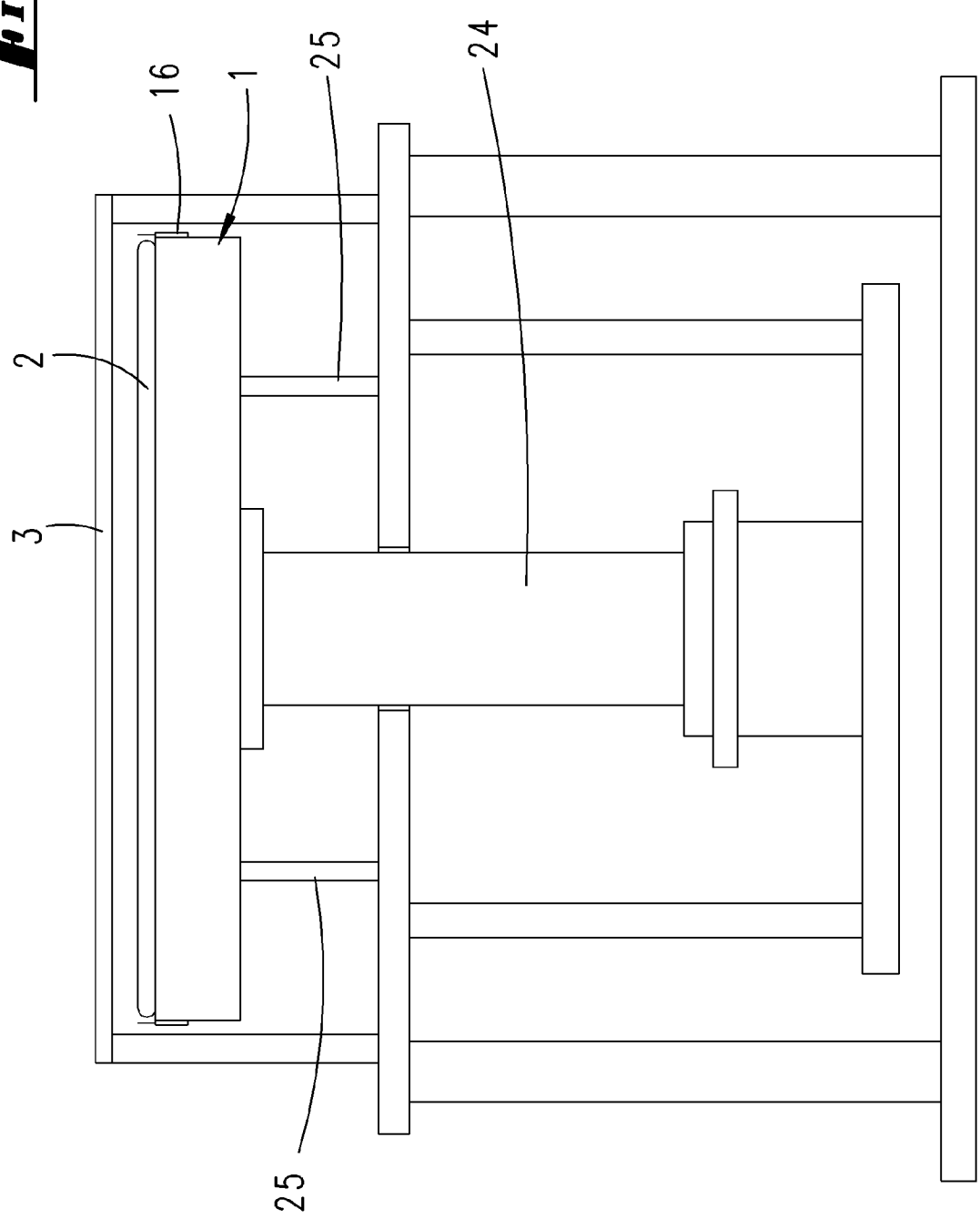
FIG. 14 shows the schematic illustration of a substrate support together with a lifting device 24 associated therewith.

The lifting device illustrated in a rough schematic manner in FIG. 14 is situated inside a reactor. The reactor is a container, made in particular of stainless steel, into which a gas feed line opens. The gas feed line in particular opens into a gas inlet element, formed in the manner of a shower head, which is situated above a substrate support 1. Reactive components, which may be present in gaseous or aerosol form, are introduced together with a carrier gas into the process chamber. These precursors may be monomers or dimers. The reactor also has a gas outlet element through which unconsumed process gases and the carrier gas are discharged from the process chamber. A regulated vacuum pump is provided for producing a vacuum or a low-pressure system. The reactor also has a loading opening (not illustrated) through which a shadow mask 3 or a substrate 2 may be introduced into the process chamber. In the exemplary embodiment, the substrate support 1 is formed as a cooling block made of aluminum, and rests on a lifting device 24. The substrate support 1 may be displaced in the vertical direction by means of the lifting device 24. In a loading position the substrate support 1 is in a lowered position, not illustrated. Pins denoted by reference numeral 25 project through openings (not illustrated) and through the substrate support 1; the substrate 2 illustrated lying on the substrate support 1 in FIG. 14 sits on the pins when the substrate support 1 is lowered. In this position lying on the pins 25, the substrate 2 may be removed and replaced with another substrate. The shadow mask 3 is in the vertical direction above the substrate, and is held in this position by a mask support. The shadow mask 3 extends parallel to the substrate 2. Starting from the position illustrated in FIG. 14, the lifting device 24 is able to lift the substrate support 1 together with the substrate 2 lying on the bearing surface 1' of the substrate support 1 until the substrate surface 2' abuts against the bottom surface of the shadow mask 3.

FIG. 15 shows the interior structure of the substrate support 1, likewise in a rough schematic illustration. Two meandering cooling circuits 14, 15 are illustrated here. The inlet 14' of the first cooling circuit 14 is situated directly adjacent to the outlet 15" of the second cooling circuit 15. The inlet 15' of the second cooling circuit 15 is situated directly adjacent to the outlet 14" of the first cooling circuit 14. The two cooling circuits 14, 15 are each situated in a plane that is parallel to the substrate bearing surface P. The channels of the cooling circuits 14, 15 which extend in a meandering manner intersect one another multiple times.

Figure 1:
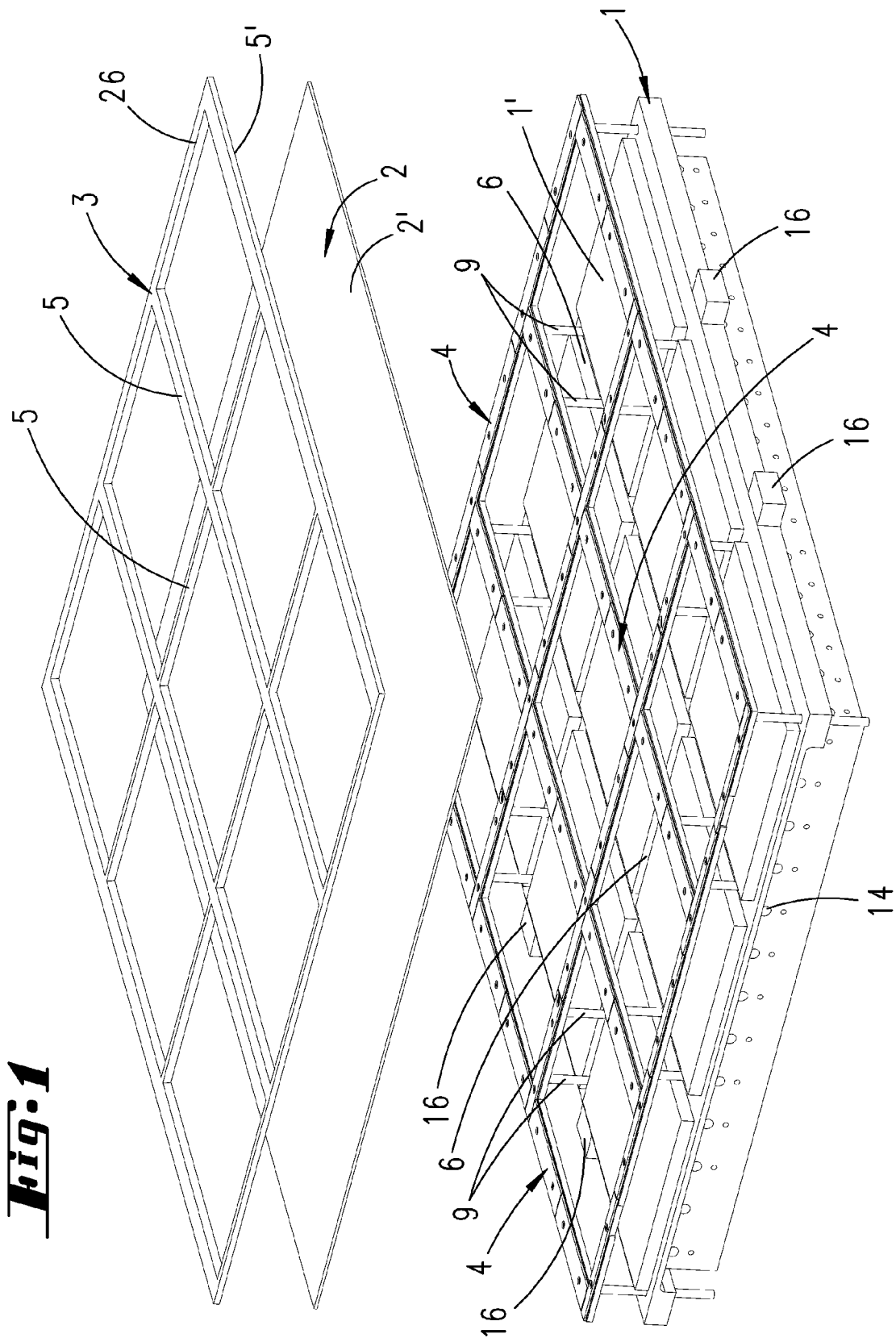
FIG. 1 shows an exploded illustration of the essential elements of a substrate support in addition to a substrate and a shadow mask.
Figure 2:
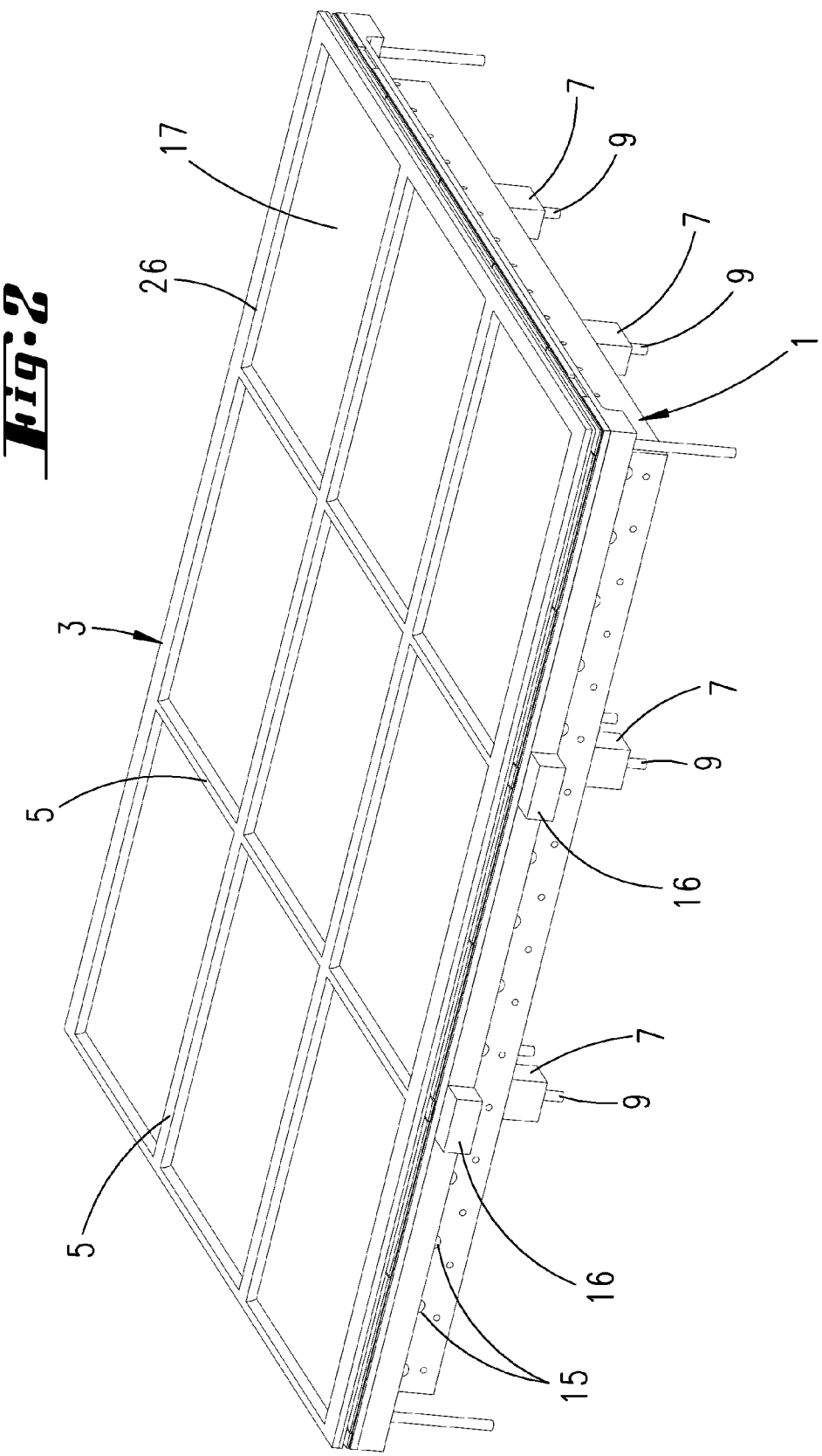
FIG. 2 shows an illustration corresponding to FIG. 1, the substrate lying on the substrate support and the shadow mask lying on the substrate.
Figure 3:
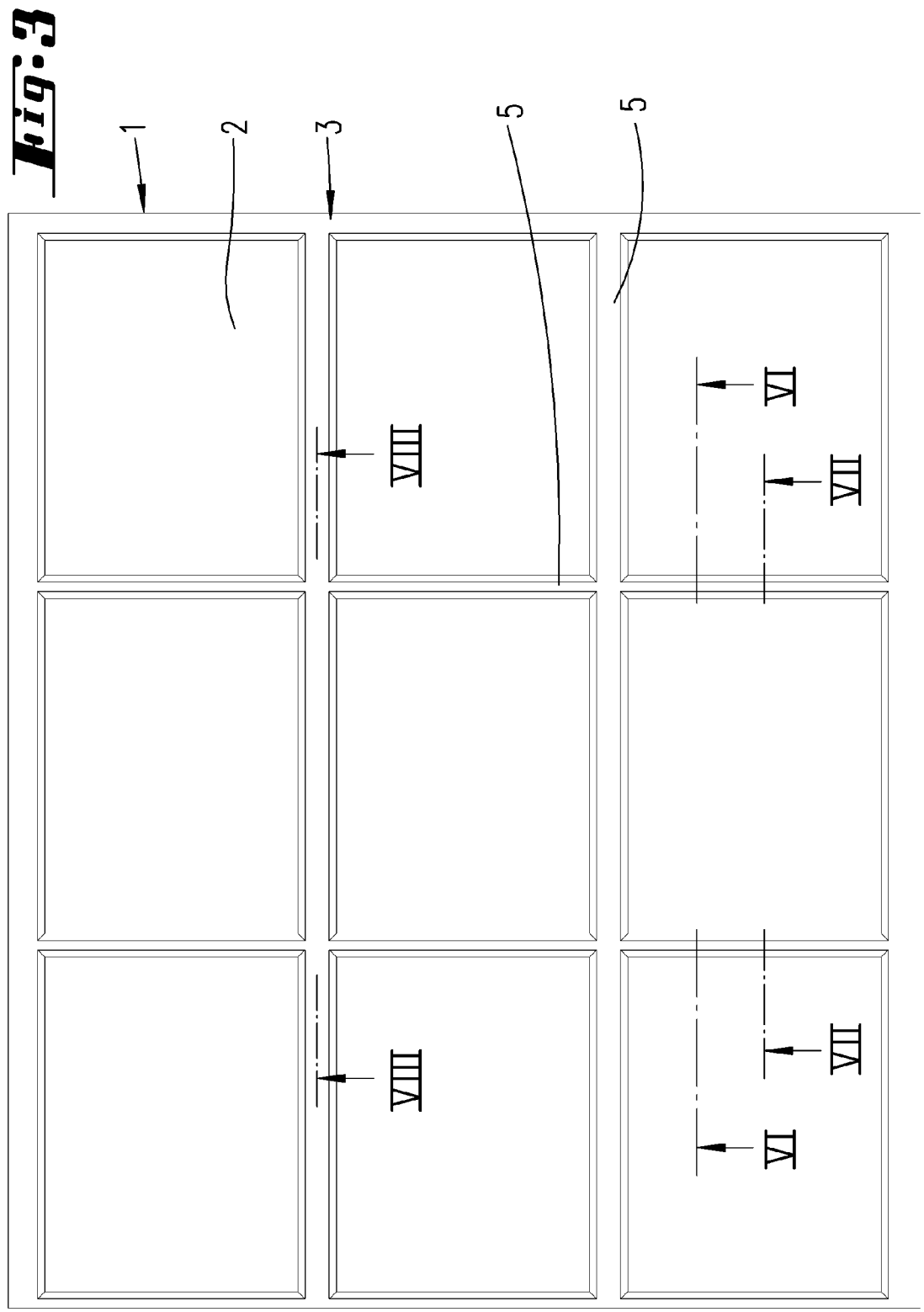
FIG. 3 shows a top view of the illustration according to FIG. 2.
Figure 4:
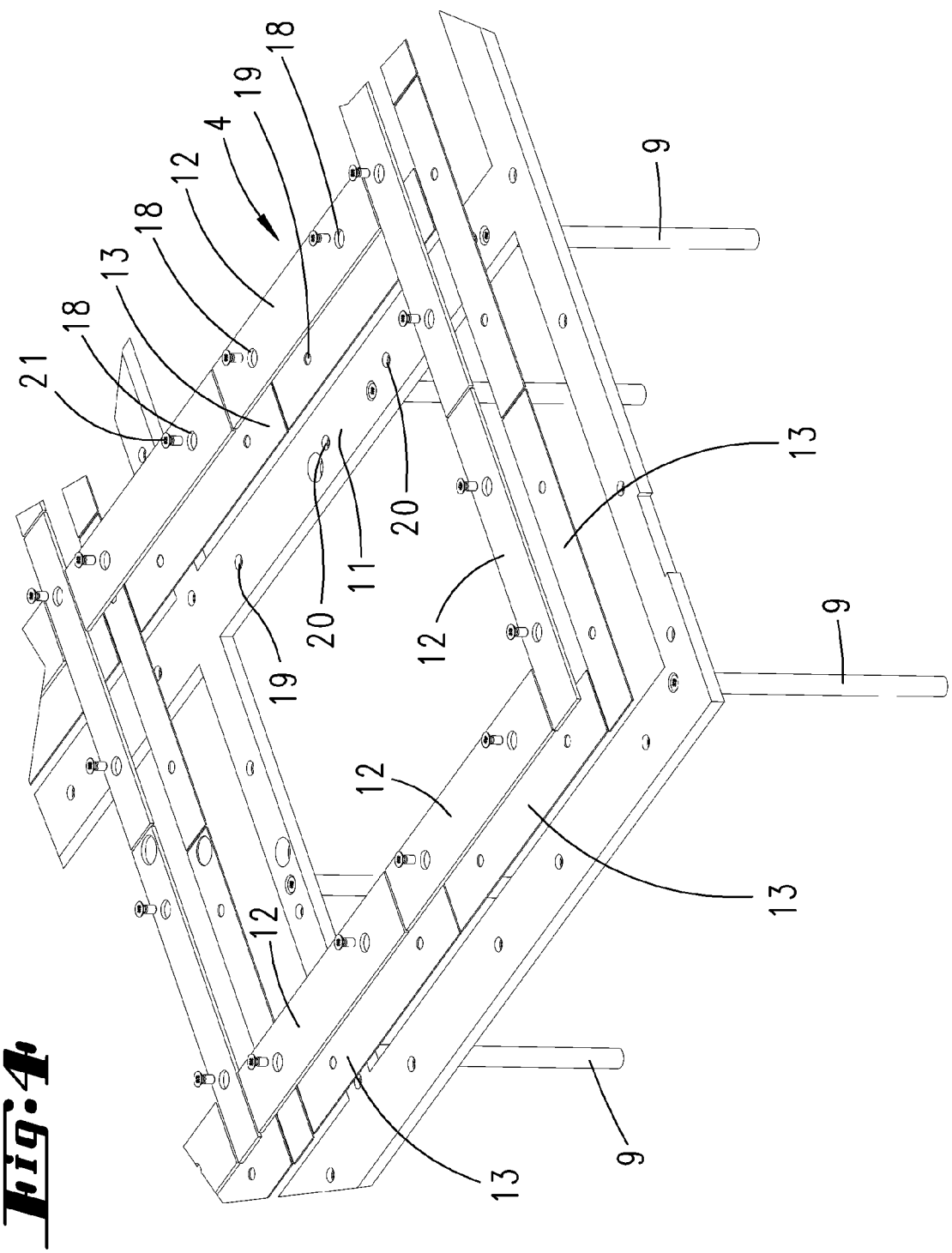
FIG. 4 shows an exploded illustration of the structure of the magnetic web arrangement of the substrate support.
Figure 8:
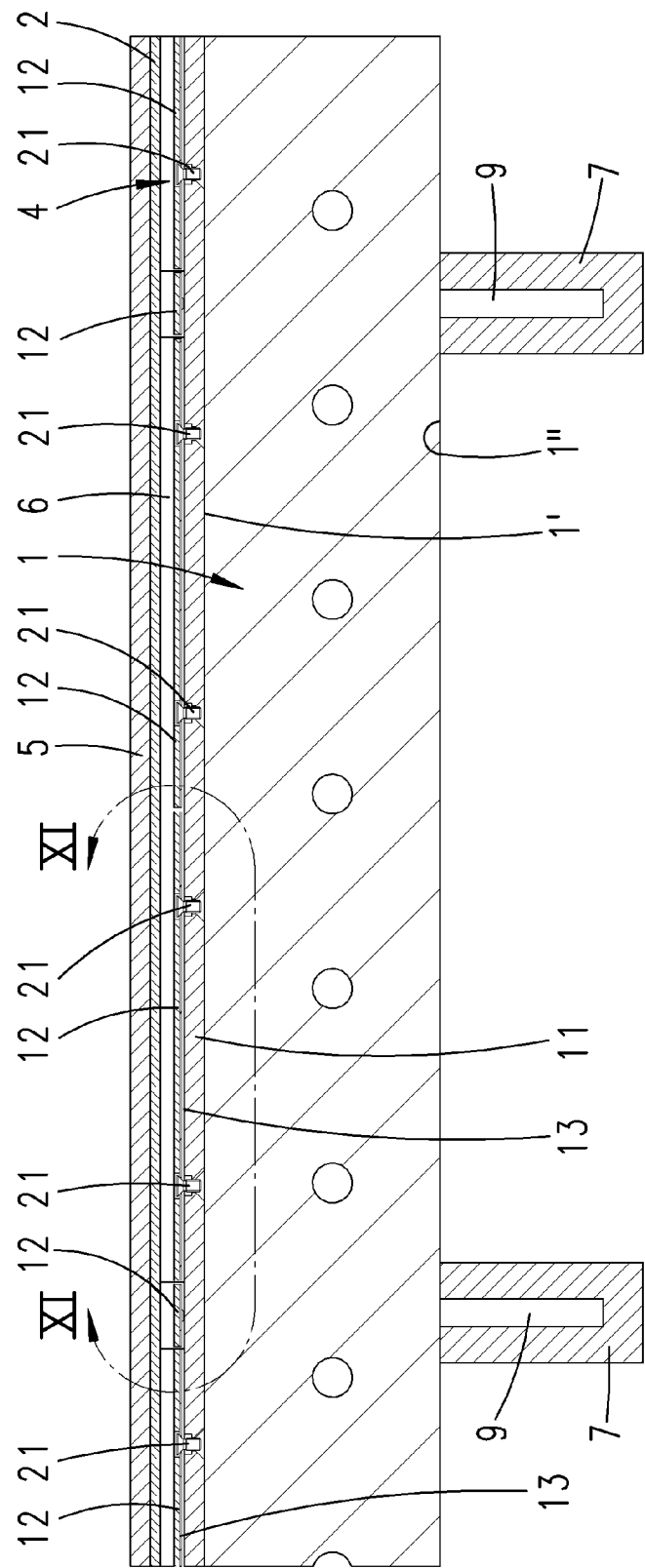
FIG. 8 shows a region according to line VIII-VIII in FIG. 3.

FIGS. 1 through 3 show various overall views of the structure of the shadow mask 3 and the top side of the substrate support 1.

The shadow mask 3 has a frame 26 which may be provided with cooling channels, not illustrated. This rectangular frame carries a total of 12 strips which integrally form a grid 5 made of Invar, a ferromagnetic material. In the exemplary embodiment the grid interspaces are rectangular. In embodiments which are not illustrated, the grid interspaces may also have a different shape. For example, the grid interspaces may have a circular, oval, or polygonal shape.

The substrate support 1 is composed of an optionally multipart aluminum block having the above-mentioned cooling channels 14, 15. The bearing surface 1' of the substrate support 1 facing the substrate 2 has recesses 6 which are provided in the form of intersecting grooves. The intersecting grooves 6 are spatially associated with the webs 5 of the shadow mask 3.

Magnetic strips 10 which are carried by a grid-shaped support member 11 lie in the recesses 6. The magnetic strips 10 are individual strip-shaped objects which are loosely connected to the support member 11 by means of one or two screws 21 so as to be individually movable. The individual magnetic strips 10 may be displaced slightly in the vertical direction relative to the support member 11 which carries them.

The support member 11, which may be made of aluminum, lies in the grooves 6. The support frame 11 is connected to a multiplicity of plungers 9 by means of screws 22. For this purpose, the end faces of the plungers 9 have threaded holes into which the screws 22 are screwed. The plungers 9 project from the bottom side 1" of the substrate support, where they are displaced by lift mechanisms 7, illustrated only schematically, in each case in a stop-limited manner. The lift mechanisms 7 may be pneumatically activated.

The individual magnetic strips 10 have a two-part design. The magnetic strips are composed of a thin permanent magnetic strip 12 which is connected to a lining strip made of sheet metal. The connection may be established using an adhesive. The permanent magnetic strip 12 has a screw head receiving opening 18 for the countersunk head of the adjusting and securing screw 21. The shank of the screw 21 projects through an opening 19 of smaller diameter in the lining plate 13. The lining plate 13 is thus held by the head of the screw 21. The screw 21 is only loosely screwed into a threaded opening 20 in the support member 11, so that a gap 23 remains between the bottom side of the lining strip 13 and the top side of the support member 11. This ensures a vertical play of motion of several tenths of a millimeter of the magnetic strip 10 relative to the support member 11.

Figure 9:
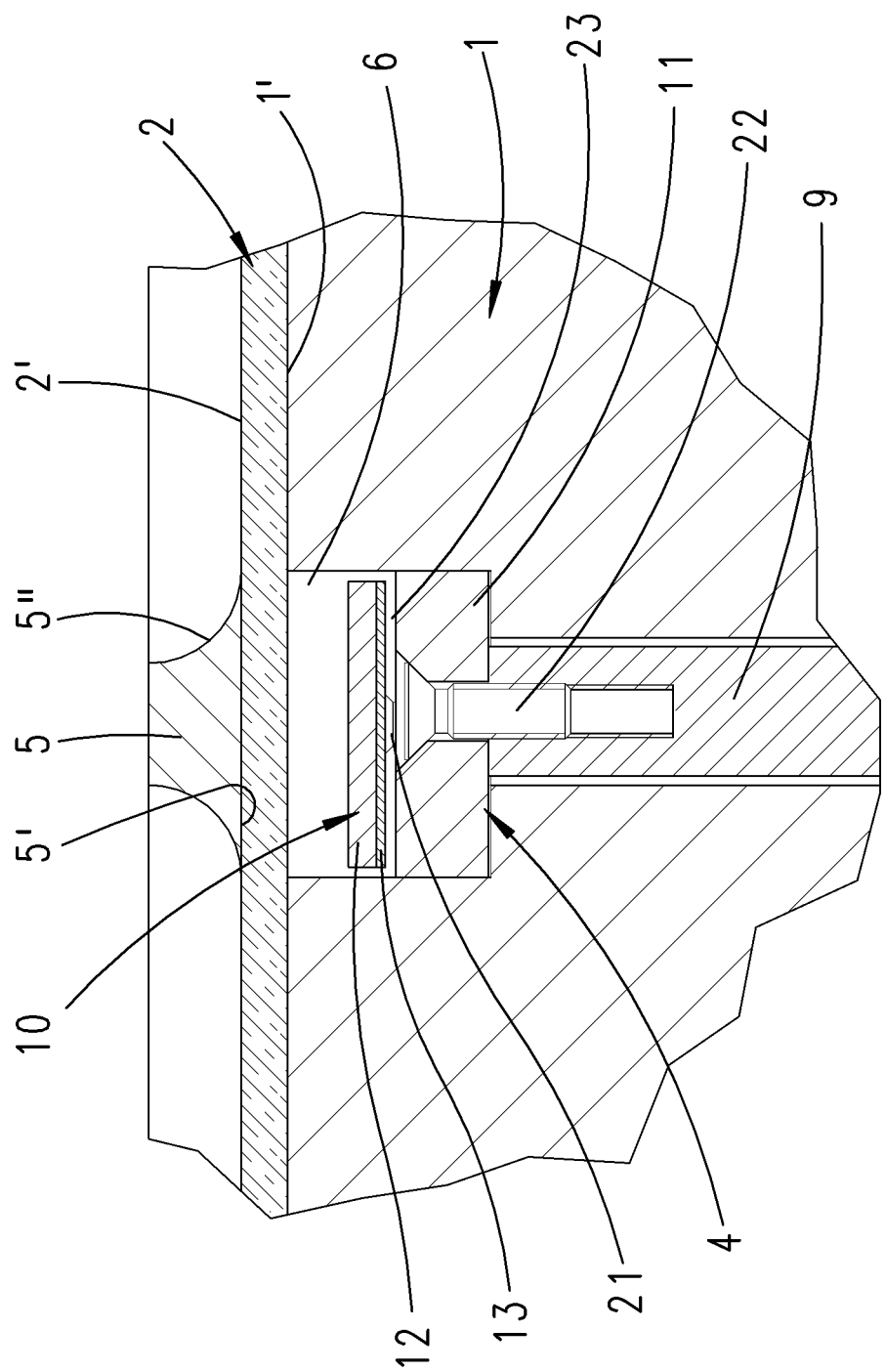
FIG. 9 shows an enlarged detail IX-IX in FIG. 6, in the inactive operating position.
Figure 10:
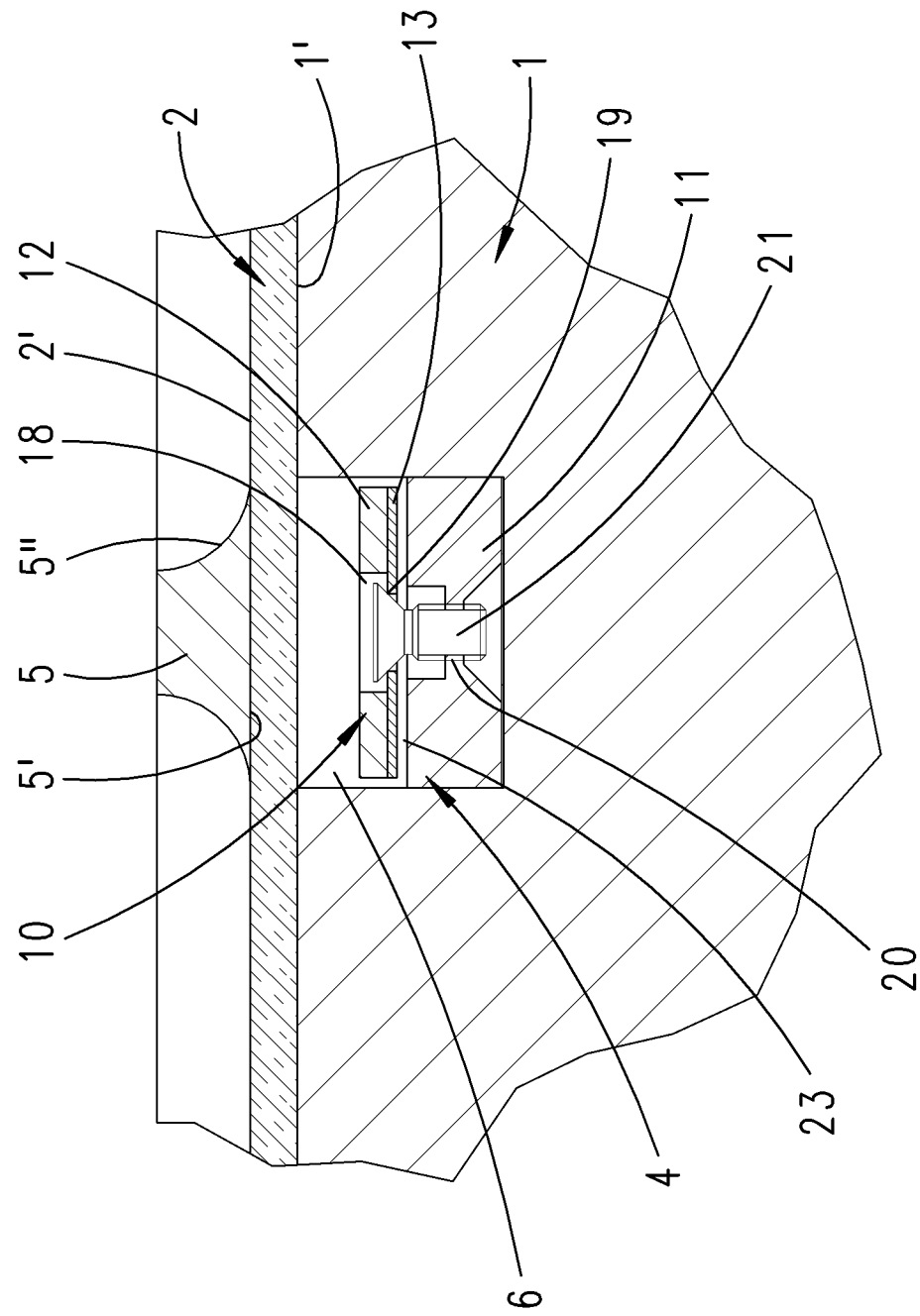
FIG. 10 shows an enlarged detail X-X in FIG. 7, in the inactive operating position.
Figure 11:
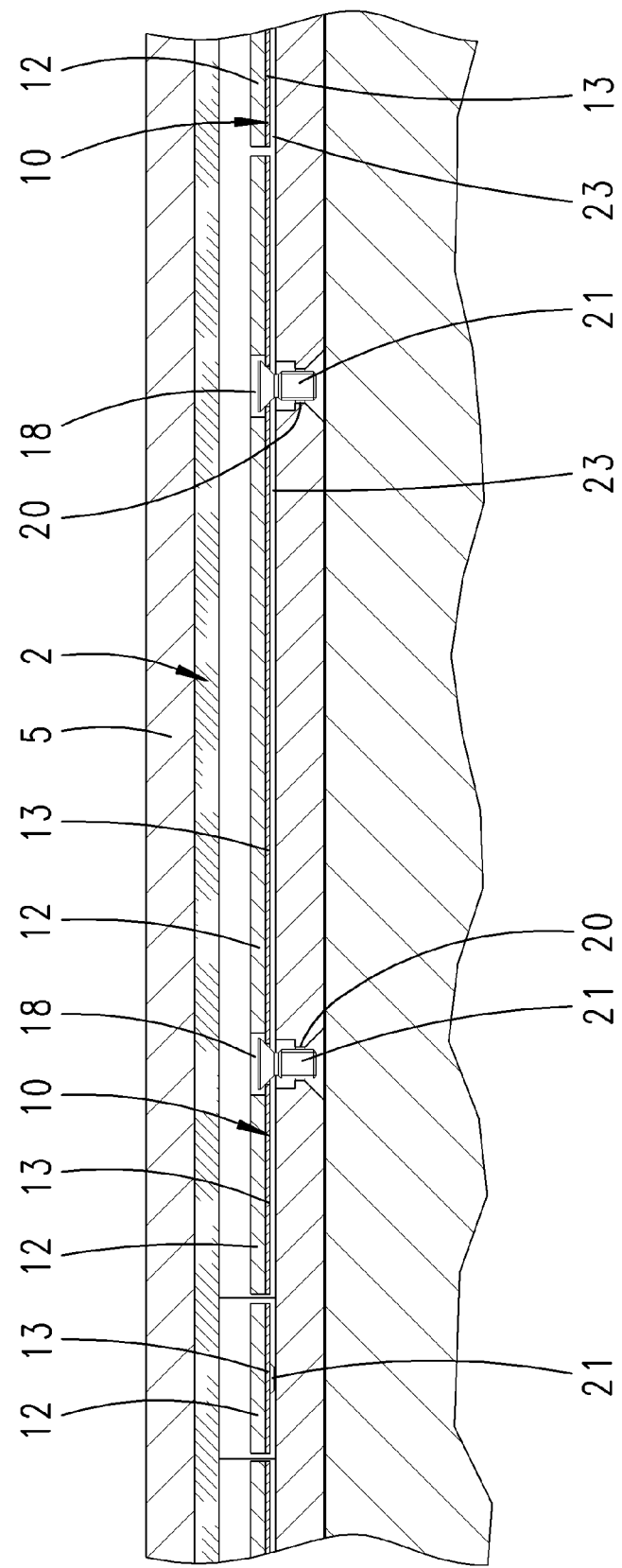
FIG. 11 shows an enlarged detail XI-XI in FIG. 8, in the inactive operating position.

In the unactivated position illustrated in particular in FIG. 10, the support member 11 is held in the vicinity of the base of the recess 6. This is achieved using the lift mechanism 7 mentioned. In this position the surface of the magnetic strip 10 is located at a distance of approximately 3 mm from the substrate bearing surface 1' of the substrate support 1. As may be further seen in FIGS. 9 and 10, the substrate 2 lies directly above the recess 6, and the web 5 of the shadow mask 3, which is made of a ferromagnetic material, lies above the substrate 2. The underside 5' of the mask web 5 may be located at a distance (not illustrated) from the substrate surface 2'.

Figure 12:
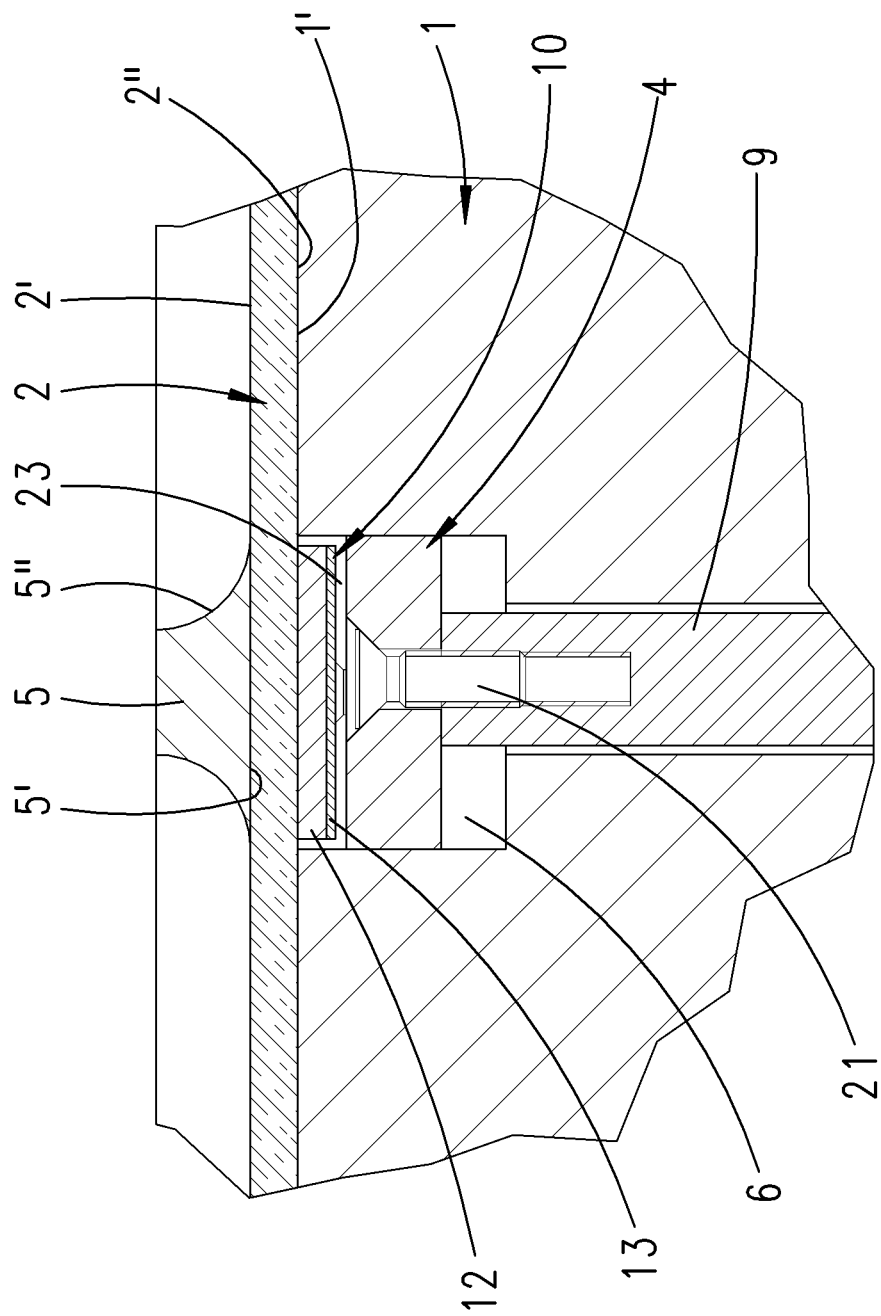
FIG. 12 shows an illustration corresponding to FIG. 9, in the active operating position.
Figure 13:
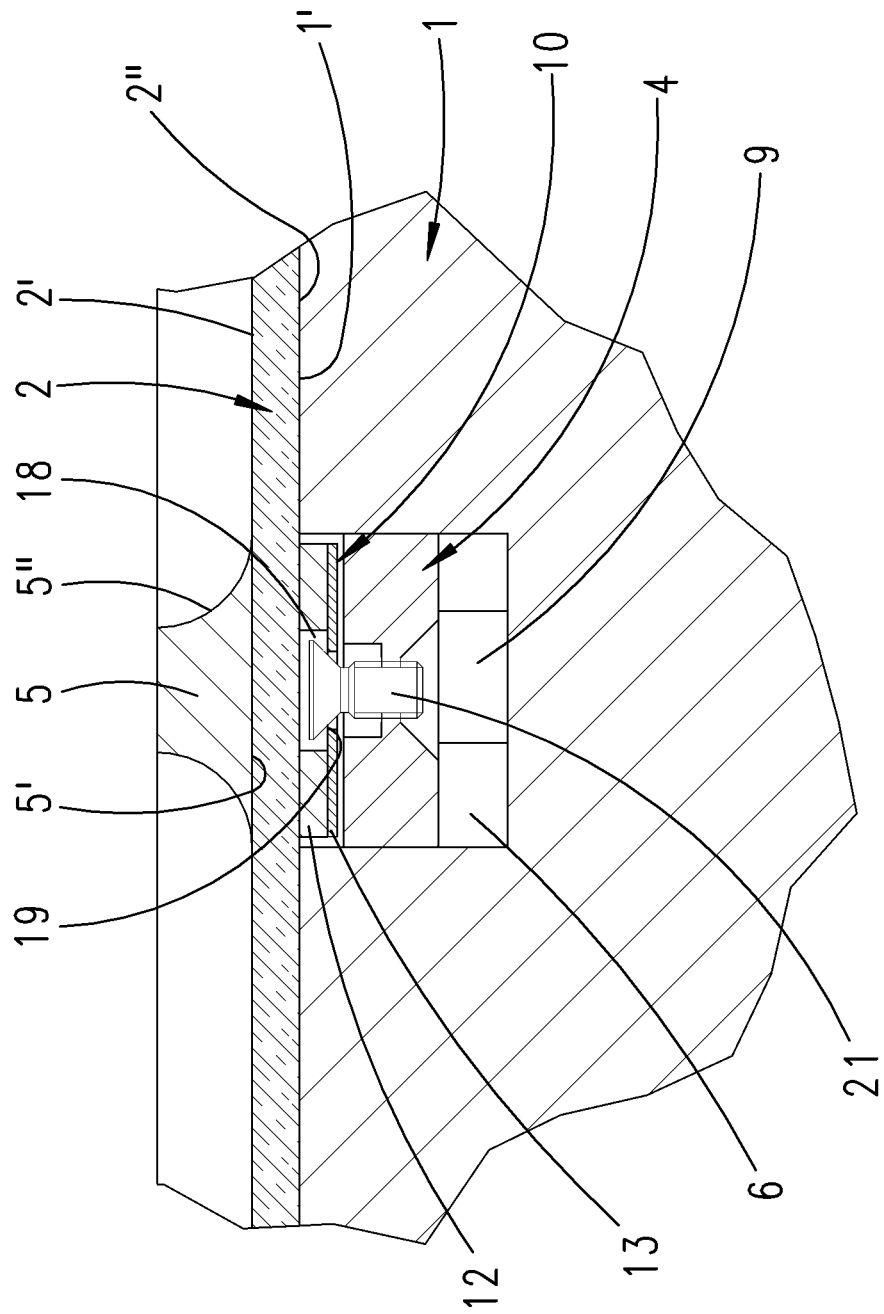
FIG. 13 shows an illustration corresponding to FIG. 10, in the active operating position.

If the support member 11 is then lifted by means of the lift mechanism 7 until it is in an end stop position, which is illustrated in particular in FIGS. 12 and 13, the magnetic strips 10 come into direct contact with the underside 2" of the substrate 2. It can be seen in FIG. 13 that the head of the screw 21 lies with a spacing profile in the opening 19 in the lining strip 13. The attractive force exerted by the permanent magnetic strip 12 holds the magnetic strip 10 to the underside 2" of the substrate, and draws the contact face 5' of the mask web 5 toward the top side 2' of the substrate 2.

It is provided that the screw 21 is an adjusting screw which may be used to adjust the maximum gap width of the gap 23. The gap may be minimized in such a way that in the active position an attractive force is exerted downward on the magnetic strip 10 via the head of the screw 21. In this case, by means of the magnetic strip 10, the substrate, i.e., the underside 2" of the substrate, is drawn toward the bearing surface 1' of the substrate support 1. Heat exchange is optimized in this manner.

However, it is also possible to additionally apply an electrostatic force by means of an electrostatic chuck system (ESC).

In addition, the cross-section of the ferromagnetic mask webs 5 may be seen in FIGS. 9, 10, 12, and 13. The contact face 5' of the mask web 5 merges into a hollow side flank 5" with formation of an acute angle.

In one exemplary embodiment not illustrated, instead of liquid cooling, it is possible to provide cooling using Peltier elements.

All features disclosed are (in themselves) pertinent to the invention. The disclosure content of the associated/accompanying priority documents (copy of the prior application) is also hereby included in full in the disclosure of the application, including for the purpose of incorporating features of these documents in claims of the present application.

What is claimed is:

1. A device for depositing laterally structured layers on a substrate (2) situated on a substrate support (1), using a shadow mask (3) lying flat on the substrate surface (2') to be coated, the substrate support (1) having first magnetic zones (4) for magnetically attracting second magnetic zones (5) of the shadow mask (3) that are spatially associated with the first magnetic zones (4), wherein, before coating the substrate (2) and when the shadow mask (3) is lying on the substrate (2), the first magnetic zones (4) are brought into an active position in which the second magnetic zones (5) are drawn toward the substrate surface (2'), and, for placement or removal of the shadow mask (3), the first magnetic zones (4) are brought into an inactive position in which an attractive force acting on the second magnetic zones (5) is reduced, the device characterized in that the first magnetic zones (4) are formed by magnetic elements, situated in recesses (6) of a substrate bearing surface (1') of the substrate support (1), which are spatially associated with the second magnetic zones (5), wherein the substrate bearing surface (1') is a flat surface,
wherein the recesses (6) are grooves in the flat surface, and said grooves have an opening in the to side of the flat surface,
wherein the magnetic elements have the shape of a web, and,
wherein the second magnetic zones (5) are likewise provided in the form of grid webs, and
further characterized in that the first magnetic zones (4) are formed by permanent magnetic elements displaced transverse to the substrate bearing surface (1') and configured to move back and forth between the active position and the inactive position.

2. A device according to claim 1, further characterized in that one of the first or second magnetic zones (4, 5) are formed by permanent magnetic elements, and the respective other one of the second or first magnetic zones (5, 4) are formed by ferromagnetic elements.

3. A device according to claim 1, further characterized in that the recesses (6) in the substrate bearing surface (1') are formed by intersecting grooves in which the magnetic elements, forming the first magnetic zones (4) lie, the magnetic elements magnetically cooperating with ferromagnetic elements forming the second magnetic zones (5) of the shadow mask (3).

4. A device according to claim 1, further characterized in that the magnetic elements in the first magnetic zones (4) of the substrate support (1) are magnetic strips (10) which by means of a lift mechanism (7) are displaced within the recesses (6) from an active position, in which the magnetic strips lie flush with the substrate bearing surface (1'), to an inactive position in which the magnetic strips lie in a countersunk position in the recesses (6).

5. A device according to claim 4, further characterized in that the lift mechanism (7) is situated on a side (1") of the substrate support (1) facing away from the substrate bearing surface (1'), and plungers (9) which pass through openings in the substrate support (1) engage with the magnetic elements in the first magnetic zones (4).

6. A device according to claim 4, further characterized in that the magnetic strips (10) are connected to a support member (11) with vertical play of motion relative to the substrate bearing surface (1'), which extends horizontally.

7. A device according to claim 4, further characterized in that the magnetic strips (10) are formed by permanent magnetic strips (12) which are adhesively bonded to a lining strip (13).

8. A device according to claim 1, further characterized by gap monitoring sensors (16) for monitoring a possible gap between a contact face (5') of a web (5) of the shadow mask (3) and the substrate surface (2').

9. A device according to claim 1, further characterized in that the substrate support (1) is a cooling element and has meandering cooling channels (14, 15), two separate channel systems (14, 15) through which coolants flow in opposite directions being provided in two planes, separated from one another, extending parallel to the substrate bearing surface (1').

10. A device according to claim 1, wherein the substrate support (1) is characterized by recesses (6) in the substrate bearing surface (1') in which permanent magnetic elements, which are displaceable in a direction normal to the substrate bearing surface (1'), lie.

11. A device according to claim 1, wherein the shadow mask (3) has webs (5) made of a magnetic material, characterized in that a contact face (5') of the webs (5) resting on the substrate (2) merges at an acute angle into a hollow or inclined side flank (5") of the web (5).

\* \* \* \* \*